United States Patent [19]

Nogle

[11] Patent Number: 5,140,192
[45] Date of Patent: Aug. 18, 1992

[54] BICMOS LOGIC CIRCUIT WITH SELF-BOOSTING IMMUNITY AND A METHOD THEREFOR

[75] Inventor: Scott G. Nogle, Austin, Tex.

[73] Assignee: Motorola, Inc., Schaumburg, Ill.

[21] Appl. No.: 561,400

[22] Filed: Aug. 1, 1990

[51] Int. Cl.$^5$ .................... H03K 19/02; H03K 3/33
[52] U.S. Cl. .................... 307/446; 307/555; 307/443; 307/451; 307/456; 307/560; 307/300; 365/189.06
[58] Field of Search .................. 307/446, 296.1, 296.8, 307/451, 456, 443, 555, 557, 560, 564, 300; 365/189.06, 189.05, 189.09

[56] References Cited

U.S. PATENT DOCUMENTS

| | | | |
|---|---|---|---|
| 4,746,817 | 5/1988 | Banker et al. | 307/451 |
| 4,825,108 | 4/1989 | Burton et al. | 307/456 |
| 4,866,674 | 9/1989 | Tran | 365/189 |
| 4,877,978 | 10/1989 | Platt | 307/555 |
| 4,897,564 | 1/1990 | Chen | 307/446 |

OTHER PUBLICATIONS

Tran et al.; An 8ns BiCMOS 1Mb ECL SRAM with a Configurable Memory Array Size; 1989 IEEE Solid State Circuits Conf. pp. 36–37.
Kertis et al.; A 12ns 256K BiCMOS SRAM; 1989 IEEE Solid State Circuits Conference, pp. 186–187.
Burnet and Hu; Hot-Carrier Degradation in Bipolar Transistors at 300 and 110 K—Effect on BiCMOS Inverter Performance; IEEE Transactions on Electron Devices, vol. 37 #4 Apr. 1990 pp. 1171–1174.

*Primary Examiner*—Edward P. Westin
*Assistant Examiner*—Richard Roseen
*Attorney, Agent, or Firm*—Paul J. Polansky

[57] ABSTRACT

A BiCMOS logic circuit with self-boosting immunity comprises a resistor, first and second transistors, a switching portion, and a discharge portion. The resistor and first transistor bias the switching portion to first and second reference voltages, which may be equal. The second transistor is a bipolar transistor providing an output signal to a load. The switching portion couples the bias voltage provided by the resistor and the first transistor to the base of the second transistor in response to a true result of a logic operation on at least one input signal and couples the base of the second transistor to a second power supply voltage terminal in response to a false result of the logic operation. The discharge portion couples the output signal to a logic low or pulldown voltage in response to a false result of the logic operation. In one form, the logic operation is a logical inversion of an input signal. In this case, the switching portion may be provided by a P-channel MOS transistor having first and second current electrodes connected serially between the bias signal and the base of the second transistor, with a gate receiving the input signal.

20 Claims, 5 Drawing Sheets

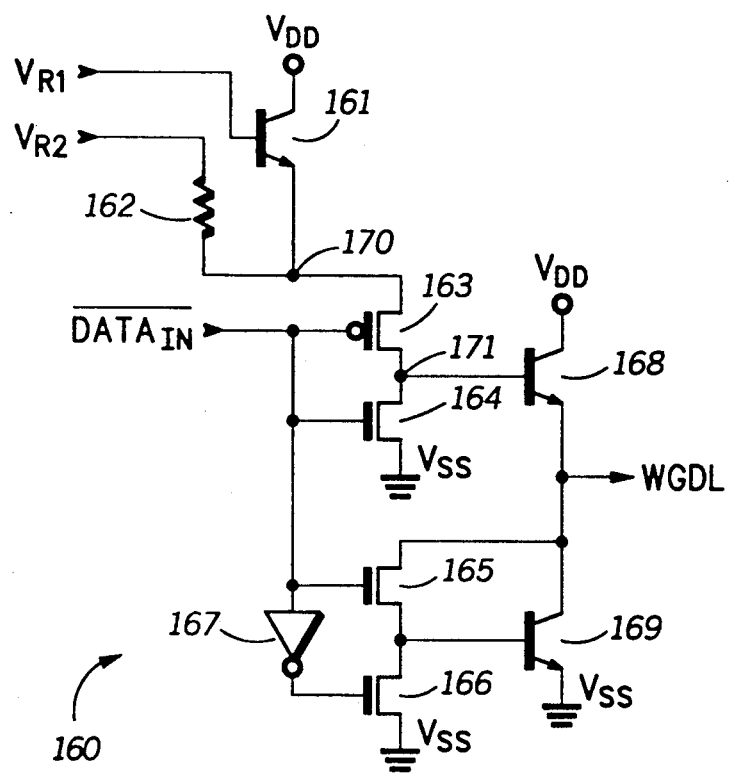
FIG.9
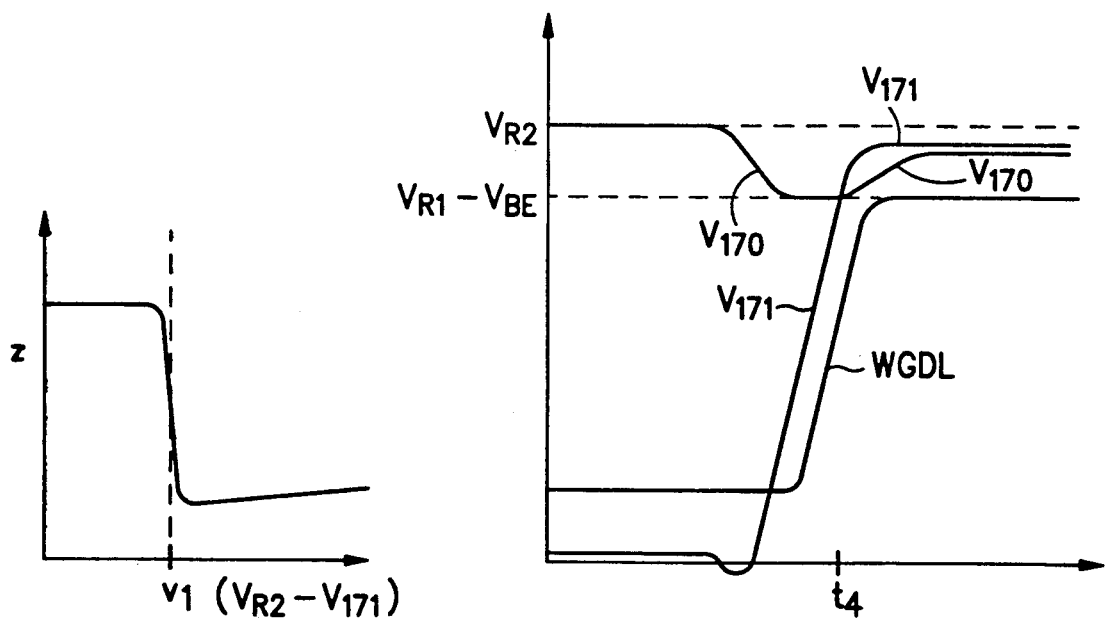
FIG.10  FIG.11

BICMOS LOGIC CIRCUIT WITH SELF-BOOSTING IMMUNITY AND A METHOD THEREFOR

CROSS-REFERENCE TO RELATED, COPENDING APPLICATION

Related copending application is application Ser. No. 07/548,809, filed Jun. 29, 1990, by Scott G. Nogle and assigned to the assignee hereof and entitled "A BICMOS Bit Line Load for a Memory With Improved Reliability and a Method Therefor".

FIELD OF THE INVENTION

This invention relates generally to BICMOS circuits, and more particularly, to BICMOS circuits with self-boosting immunity for use in integrated circuits such as memories.

BACKGROUND OF THE INVENTION

In a bipolar transistor, a junction capacitance exists between the P and N areas of silicon. The junction capacitance arises from the minority charge-storing capacity of a PN junction. For example, an NPN transistor has a base-emitter capacitance at the PN base-emitter junction. Minority (N-type) carries are stored in the P-type base near the junction, and minority (P-type) carriers are stored in the N-type emitter near the junction. The capacitance, sometimes referred to as the diffusion capacitance, represents the ability of the P-type base and the N-type emitter to store minority charge near the junction. The capacitance is determined in part by the bias on the PN junction, and as the forward bias increases, the capacitance also increases.

In some circumstances, the base-emitter capacitance can be significant enough to affect circuit performance. In a circuit using a bipolar transistor as an emitter follower, the base-emitter capacitance can affect the output voltage on the emitter after the base voltage changes. In the emitter follower configuration, when the voltage on the base increases, the voltage on the emitter follows, rising by the same amount. The expected voltage on the emitter is equal to the voltage on the base, minus one base-to-emitter diode voltage drop ($V_{BE}$). However under certain circumstances, the voltage on the base may be self-boosted by the effect of the base-emitter capacitance. When the voltage applied to the base rises quickly, and the load connected to the emitter is highly capacitive, a large base-to-emitter voltage can develop. Then as the voltage on the emitter rises, a bootstrap effect increases the base voltage due to the base-emitter capacitance. If the loading is sufficiently capacitive, then the voltage on the base rises beyond the voltage applied. Eventually, the voltage on the emitter follows the voltage on the base above the voltage on the base minus $V_{BE}$. If there is no path to discharge the base-emitter capacitor, the voltage on the emitter remains above the desired voltage level.

For some circuit applications, the possibility that the output voltage will self-boost beyond the desired value is harmful to operation of the circuit. For example, in integrated circuit memories, the voltage provided by a write line driver when driving a logic high voltage must be limited to a maximum amount. To allow the output voltage to self-boost would diminish the reliability of the memory.

DESCRIPTION OF THE PREFERRED EMBODIMENT

Accordingly, there is provided, in one form, a logic circuit comprising a resistor, first and second transistors, switching means, and discharge means. The resistor has a first terminal coupled to a first reference voltage terminal, and a second terminal. The first transistor has a collector coupled to a first power supply voltage terminal, a base coupled to a second reference voltage terminal, and an emitter coupled to the second terminal of the resistor. The second transistor has a collector coupled to a first power supply voltage terminal, a base, and an emitter for providing an output signal. The switching means is for coupling the second terminal of the resistor to the base of the second transistor in response to a true result of a logical operation on at least one input signal. The discharge means is coupled to the emitter of the second transistor, and is for coupling the output signal to a second power supply voltage terminal in response to a false result of the logical operation on the at least one input signal.

These and other objects, features and advantages will be more clearly understood from the following detailed description taken in conjunction with the accompanying drawings.

BRIEF DESCRIPTION OF THE DRAWINGS

FIG. 9 illustrates in partial schematic form one embodiment of the present invention;

FIG. 10 shows a graph plotting impedance versus a voltage difference to illustrate the present invention; and FIG. 11 shows a timing diagram of signals pertinent to FIG. 9 useful in understanding the present invention.

DETAILED DESCRIPTION OF THE INVENTION

Figure 1:
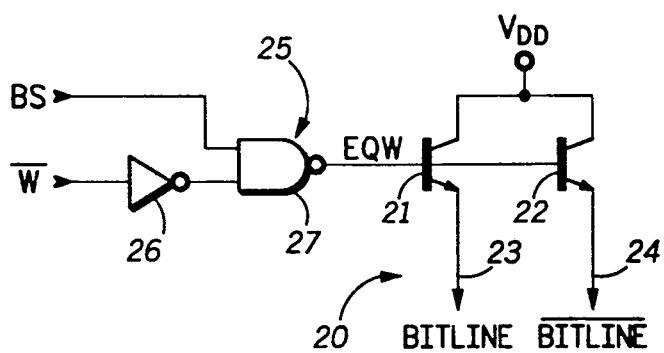
FIG. 1 illustrates in partial schematic form a bit line load in accordance with the prior art and a control circuit therefor.

FIG. 1 illustrates in partial schematic form a bit line load 20 in accordance with the prior art, and control circuit 25 therefor. See, for example, "Bitline Pull-Up Circuit for a BICMOS Read/Write Memory" by Tran in U.S. Pat. No. 4,866,674, issued 12 Sep. 1989; Kertis et. al., "A 12 ns 256K BiCMOS SRAM", in 1989 *IEEE Solid State Circuits Conference*, p. 187. Bit line load 20 comprises an NPN transistor 21 having a collector connected to a positive power supply voltage terminal labelled "$V_{DD}$", a base for receiving a signal labelled "EQW", and an emitter coupled to a bit line 23 having a signal labelled "BITLINE" thereon; and an NPN transistor 22 having a collector connected to $V_{DD}$, a base for receiving signal EQW, and an emitter coupled to a bit line 24 having a signal labelled "$\overline{\text{BITLINE}}$" thereon. Control circuit 25 comprises an inverter 26 having an input terminal for receiving a write signal labelled "$\overline{W}$", and an output terminal; and a NAND gate 27 having a first input terminal for receiving a block select signal labelled "BS", a second input terminal connected to the output terminal of inverter 26, and an output terminal for providing EQW.

Signal EQW causes transistors 21 and 22 to precharge bit lines 23 and 24. EQW is asserted in response to either signal BS being negated as a logic low, or signal $\overline{W}$ being negated as a logic high. A write recovery period occurs between a time at which either BS or $\overline{W}$ is negated, until voltages on bitlines 23 and 24 are substantially equal. EQW is negated in response to both signals BS and $\overline{W}$ being asserted, indicating a write access to the memory block in which bit line load 20 is located. When EQW is asserted, transistors 21 and 22 increase the voltage on the corresponding bit line, bit line 23 or bit line 24 respectively, to a base-to-emitter threshold voltage ($V_{BE}$) below EQW. Also typically an MOS transistor, coupled between bit line 23 and bit line 24 (not shown in FIG. 1), is made conductive to equalize the voltage therebetween. Because bit line load 20 uses bipolar transistors 21 and 22, the speed of precharging of the voltage on the bit lines after the termination of the write cycle is improved over the use of CMOS transistors.

There is a problem with bit line load 20, however. During the write recovery period, bit line load 20 provides a voltage on bit lines 23 and 24 equal to approximately (EQW $-V_{BE}$). However, during a write cycle EQW is negated to a logic low. NAND gate 27, typically implemented using CMOS transistors, provides EQW at a logic low voltage very close to the negative power supply voltage, designated "$V_{SS}$", typically at zero volts. Hence, a large reverse bias is developed between the emitter and the base of either transistor 21 or transistor 22. If the maximum reverse bias is designated "$V_{RBMAX}$", then $$V_{RBMAX} = EQW' - V_{BE} - V_{SS} \qquad (1)$$

If EQW is equal to 5 volts, $V_{BE}$ is equal to 0.7 volts, and $V_{SS}$ is equal to 0 volts, $V_{RBMAX}$ would equal 4.3 volts. Over time, the constant application of this large reverse bias may cause transistor 21 or transistor 22 to fail, resulting in a failure of the entire memory. Electronically, a large reverse bias on a PN junction causes hot carrier injection into the overlying oxide, resulting in poor junction performance. See, for example, "Hot-Carrier Degradation in Bipolar Transistors at 300 and 110 K—Effect on BiCMOS Inverter Performance", by Burnett and Hu in *IEEE Transactions on Electron Devices*, vol. 37, no. 4, April 1990, pp. 1171-1173. The amount of hot carrier injection is proportional to the time the reverse bias occurs. The size of $V_{RBMAX}$ is related to the mean life of the transistor, for given worst case conditions, by an inverse semilogarithmic relationship; as $V_{RBMAX}$ decreases linearly, mean life increases exponentially. At a $V_{RBMAX}$ of 4.3 volts, transistor mean life of bit line load 20 is unacceptably short.

Figure 2:
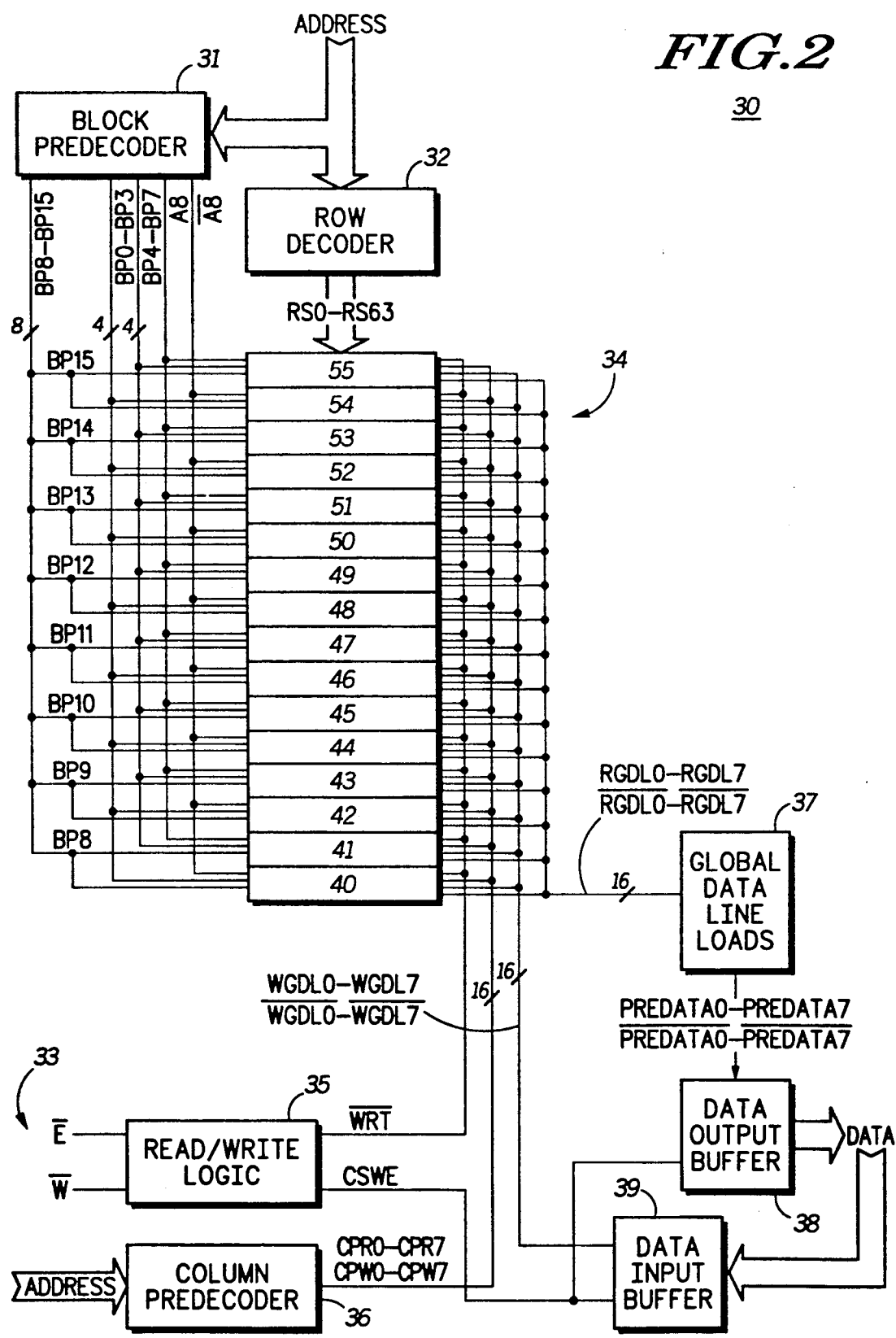
FIG. 2 illustrates in block form a memory incorporating the present invention.

FIG. 2 illustrates in block form a memory 30 incorporating the present invention. FIG. 2 shows features pertinent to understanding the present invention, but omits other features. Memory 30 comprises generally a block predecoder 31, a row decoder 32, an input/output portion 33, and a memory block portion 34. Input/output portion 33 comprises a read/write logic block 35, a column predecoder 36, a global data line load portion 37, a data output buffer 38, and a data input buffer 39. Memory block portion 34 comprises a plurality of memory blocks; in the illustrated embodiment, memory block portion 34 comprises sixteen memory blocks 40-55.

Block predecoder 31 receives a first portion of a plurality of address signals labelled "ADDRESS" and provides predecoded block signals labelled "A8", "$\overline{A8}$", "BP0-BP3", "BP4-BP7", and "BP8-BP15" in response. A particular memory block receives a unique combination of predecoded block signals which determines when the block is selected. Even-numbered memory blocks receive $\overline{A8}$, whereas odd-numbered blocks receive A8; memory blocks 40 and 41, 42 and 43, 44 and 45, 46 and 47, 48 and 49, 50 and 51, 52 and 53, and 54 and 55 respectively receive signals BP8, BP9, BP10, BP11, BP12, BP13, BP14, and BP15. Even-numbered memory blocks receive BP0-BP3, whereas odd-numbered memory blocks receive BP4-BP7, for further decoding. Row decoder 32 receives a second portion of ADDRESS and provides row select signals labelled "RS0-RS63" in response. RS0-RS63 are provided to each memory block.

Read/write logic block 35 receives as inputs an enable signal labelled "$\overline{E}$", and a write signal labelled "$\overline{W}$". Read/write logic block 35 provides a write signal labelled "$\overline{WRT}$" to each of memory blocks 40-55, and a control signal labelled "CSWE" to data output buffer 38 and data input buffer 39 in response. $\overline{WRT}$ is a buffered signal indicating a write cycle is in progress. CSWE is a signal indicating that either a read cycle or a write cycle is in progress. Column predecoder 36 receives a third portion of ADDRESS and provides a plurality of predecoded column signals labelled "CPR0-CPR7" and "CPW0-CPW7" in response. Global data line loads 37 couple to each of 8 differential global data line pairs labelled "RGDL0-RGDL7" and "$\overline{RGDL0-RGDL7}$". Global data line loads 37 provide signals labelled signals labelled "PREDATA0-PREDATA7" and "$\overline{PREDATA0-PREDATA7}$" in response. Data output buffer 38 couples to PREDATA0-PREDATA7 and $\overline{PREDATA0-PREDATA7}$ and provides a plurality of data signals labelled "DATA" in response. The number of signals in DATA corresponds to the number of global data line pairs; here, there are eight data signals provided on DATA. However, the number of data bits provided by memory 30 may vary in different embodiments so the number of data signals in DATA is left indeterminate to illustrate this. Data input buffer 39 receives DATA and provides 8 write data line signal pairs labelled "WGDL0-WGDL7" and "$\overline{WGDL0-WGDL7}$" in response.

FIG. 2 is useful in understanding the operation of a memory in which the present invention operates. Memory 30 is capable of performing read and write cycles. Memory 30 is organized as 16 blocks, with each block organized as 256 rows and 64 columns. A function which can be considered row decoding uses the first portion of the address to enable one block and to enable one local word line in the block. Thus, row decoding decodes one of 4096 local word lines in memory 30. The row decoding function encompasses block predecoder 31 and row decoder 32. A local word line is enabled in an enabled memory block in response to RS0-RS63 and a plurality of predecoded block signals received from block predecoder 31. Column decoding decodes eight bit line pairs out of 64 bit line pairs on the enabled local word line. Row redundancy is also possible but is not shown in FIG. 2. The organization of memory 30 may be altered in different embodiments, as well as which portions of ADDRESS are used respectively for row and column decoding.

In the read cycle, signal $\overline{E}$ is asserted and signal $\overline{W}$ is negated. Read/write logic block 35 keeps signals $\overline{WRT}$ and CSWE negated. Block predecoder 31 selectively asserts signals A8, $\overline{A8}$, and BP0-BP15 in response to the first portion of ADDRESS. Row decoder 32 selectively asserts a row select signal of RS0-RS63 in response to the second portion of ADDRESS. The memory block selected by the predecoded signals A8, $\overline{A8}$, and a corresponding signal from the group BP8-BP15, then uses the remaining predecoded signals BP0-BP7, along with an active row select signal of RS0-RS63, to activate one local word line. Then within the selected block, each memory cell on the activated local word line provides its contents onto a corresponding differential bit line pair. Further column decoding among the bit line pairs is performed using CPR0-CPR7. The type of cycle in progress determines which signal is asserted, either one of CPR0-CPR7 for a read cycle, or one of CPW0-CPW7 for a write cycle. During the read cycle, one signal of CPR0-CPR7 is asserted to select one of eight bit line pairs in a selected memory block to output on a corresponding global data line pair. Thus, CPR0-CPR7 decode 8 of 64 bit lines. Eventually, eight bit line pairs are selected. A selected memory cell thus is located at an intersection of an enabled local word line and a selected bit line pair, in an enabled memory block.

The differential voltage on each of the eight selected bit line pairs is received and sensed by global data line loads 37 which convert the output of the memory blocks, a differential current, into a differential voltage on signals PREDATA0-PREDATA7 and $\overline{PREDATA0-PREDATA7}$. The data bits represented differentially as PREDATA0-PREDATA7 and $\overline{PREDATA0-PREDATA7}$ are then provided externally to memory 30 by data output buffer 38.

In the write cycle, the flow of data is essentially reversed. Data input buffer 39 receives DATA and provides each data bit differentially onto a corresponding write global data line pair in response. Since memory 30 is organized to store or provide eight data bits of memory per access, DATA is provided on eight differential write global data line pairs WGDL0-WGDL7 and $\overline{WGDL0-WGDL7}$. Signals CPW0-CPW7 from column predecoder 36 are used in a selected memory block to perform column decoding to couple the eight write global data lines to eight bit line pairs. During the write cycle, one signal of CPW0-CPW7 is asserted to select one of eight bit line pairs in a selected memory block to output on a corresponding global data line pair. Thus, CPW0-CPW7 decode 8 of 64 bit lines. The local word line decoding occurs in the same manner as for the read cycle. The differential voltage developed on the bit line pairs is much larger for the write cycle than for the read cycle in order to overwrite the contents of the selected memory cells.

Figure 3:
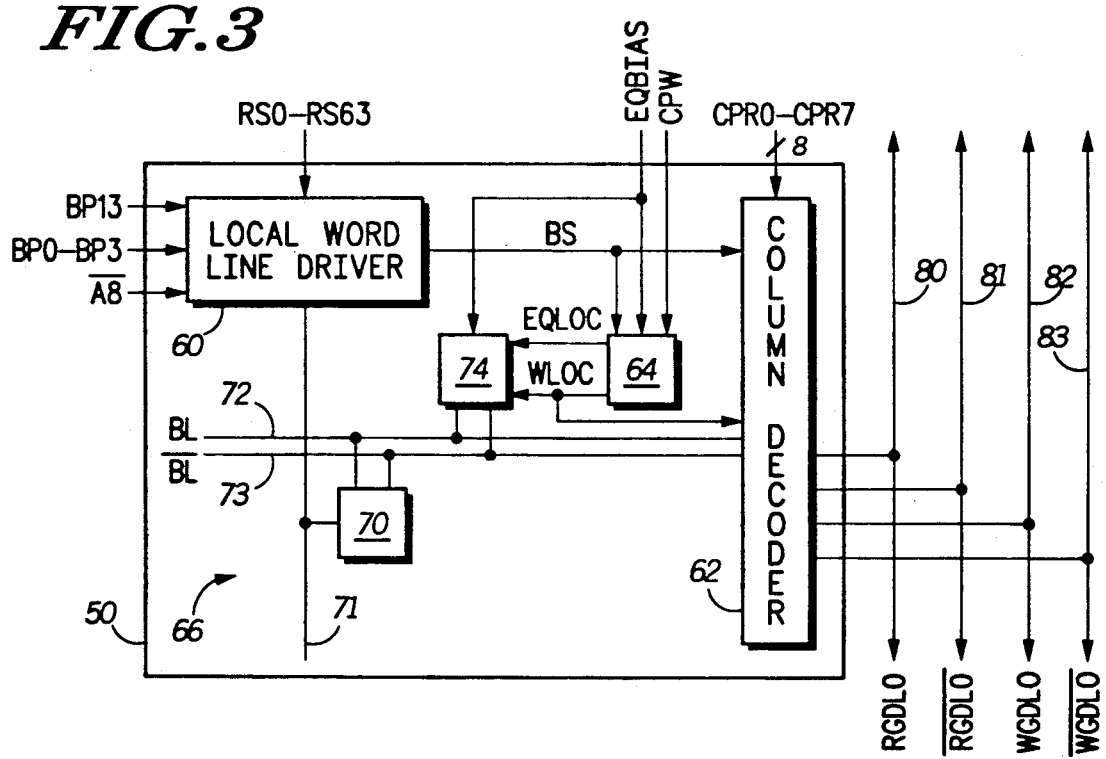
FIG. 3 shows a block diagram of a portion of a memory block of the memory of FIG. 2.

FIG. 3 illustrates in block form a portion of memory block 50 of memory 30 of FIG. 2. Memory block 50 comprises a local word line driver block 60, a column decoder 62, a control signal generator circuit 64, and a memory array 66. Local word line driver block 60 provides 256 local word line signals, including a representative local word line 71, in response to input row select signals RS0-RS63, block signals BP0-BP3 and $\overline{A8}$. In addition, it provides a block select signal labelled "BS" in response to BP13 and $\overline{A8}$. Memory array 66 comprises a plurality of memory cells at each intersection of a local word line and a bit line pair. In FIG. 3, a representative memory cell 70 is located at an intersection of local word line 71 and a bit line pair comprising a bit line 72 providing a signal labelled "BL" thereon, and a bit line 73 providing a signal labelled "$\overline{BL}$" thereon. Bit lines 72 and 73 are coupled to column decoder 62. Column decoder 62 also receives a signal labelled "WLOC" and BS. WLOC is a signal of a group of signals labelled "WLOC0-WLOC7", not shown in FIG. 3, corresponding to the column address of memory cells on bit lines 72 and 73; it is designated generically to emphasize this fact. Coupled to bit lines 72 and 73 is bit line load 74, which receives as inputs EQBIAS, EQLOC, and WLOC. Control circuit 64 receives signals EQBIAS and CPW to provide signals EQLOC and WLOC. CPW is a signal of the group CPW0-CPW7, received by memory block 50, corresponding to the column address of memory cells on bit lines 72 and 73; it is designated generically to emphasize this fact. Other control circuits receive other corresponding predecoded column signals of the group CPW0-CPW7. Column decoder 62 receives eight signals CPR0-CPR7 and couples to each bit line pair in memory array 66, and couples to eight read global data line pairs (not all shown in FIG. 3). Shown in FIG. 3 is a read global data line pair comprising a first read global data line 80 providing $\overline{RGDL0}$ thereon, and a second read global data line 81 providing RGDL0 thereon, coupled to the output of column decoder 62; and a write global data line pair comprising a first write global data line 82 providing WGDL0 thereon, and a second write global data line 83 providing $\overline{WGDL0}$ thereon, coupled to an input of column decoder 62.

In operation, memory block 50 is selected by the assertion of predecoded signals $\overline{A8}$ and BP13. When $\overline{A8}$ and BP13 are asserted, local word line driver 60 asserts signal BS to activate selected bit line loads and to activate column decoding performed by column decoder 62. When memory block 50 is selected, local word line driver block 60 provides one of 256 word lines in response to RS0-RS63 and eight additional predecoded block signals BP0-BP7. In the read cycle, if memory block 50 is selected and local word line driver block 60 asserts local word line 71, then memory cell 70 couples a data bit stored therein differentially onto bit lines 72 and 73. Bit line load 74 provides an active pull up on bit lines 72 and 73. If a binary 1 is stored in memory cell 70, then a positive differential voltage is developed between BL and $\overline{BL}$. If a binary 0 is stored in memory cell 70, then a negative differential voltage is developed between BL and $\overline{BL}$. In either case, transistors in memory cell 70 have gate sizes sufficiently large to reduce a voltage provided by bit line load 74 enough so that a differential voltage may be recognized by column decoder 62. Column decoder 62 then decodes one pair of bit lines for each read global data line pair. Each selected bit line pair is coupled to a corresponding read global data line pair, and information stored in the corresponding selected memory cell is sensed and provided as a differential current onto the corresponding read global data line.

In the write cycle, data is provided differentially from eight write global data line pairs to corresponding selected memory cells. While the decoding occurs as in the read cycle, data is received by column decoder 62 during the write cycle from write global data lines 82 and 83 providing signals WGDL0 and $\overline{\text{WGDL0}}$ thereon. A principal difference between the read cycle and the write cycle is that during the read cycle a small differential voltage is developed on the bit line pair, but during the write cycle a large differential voltage is developed on the bit line pair by column decoder 62. While the voltage developed on the bit line pair during the write cycle must be large enough to overwrite a bit stored in a corresponding memory cell, the bit line load must precharge and equalize the voltage on the bit lines sufficiently after a write cycle to avoid disturbing a following read cycle.

Figure 4:
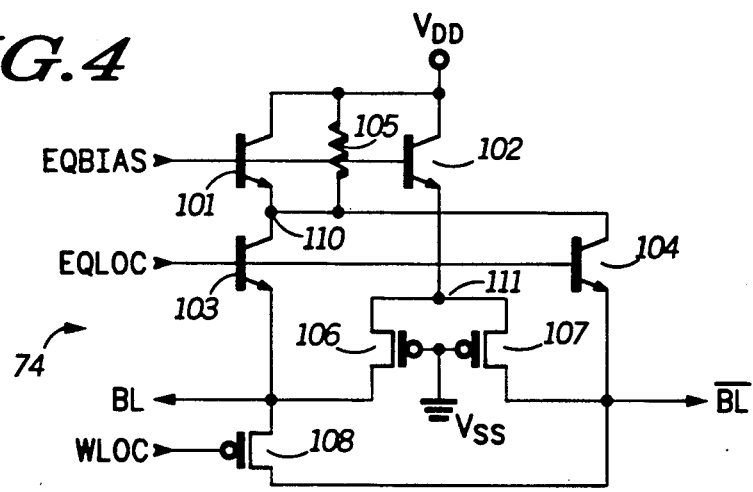
FIG. 4 illustrates in schematic form a bit line load and common voltage driver circuit shown in the memory block of FIG. 3.

FIG. 4 illustrates in schematic form bit line load 74 for use in memory 30, and NPN transistors 101 and 102 and resistor 105 used to bias bit line load 74. Bit line load 74 comprises NPN transistors 103, and 104; a resistor 105; and P-channel transistors 106, 107, and 108. Transistor 101 has a collector connected to $V_{DD}$, a base for receiving signal EQBIAS, and an emitter connected to a node 110. Transistor 102 has a collector connected to $V_{DD}$, a base for receiving signal EQBIAS, and an emitter connected to a node 111. Transistor 103 has a collector connected to node 110, a base for receiving signal EQLOC, and an emitter connected to bit line 72. Transistor 104 has a collector connected to node 110, a base for receiving signal EQLOC, and an emitter connected to bit line 73. Resistor 105 has a first terminal connected to $V_{DD}$, and a second terminal connected to node 110. Transistor 106 has a source connected to node 111, a gate connected to $V_{SS}$, and a drain connected to bit line 72. Transistor 107 has a source connected to node 111, a gate connected to $V_{SS}$, and a drain connected to bit line 73. Transistor 108 has a first current electrode connected to bit line 72, a gate for receiving signal WLOC, and a second current electrode connected to bit line 73. Which current electrode of transistor 108 functions as a source and which current electrode functions as a drain depends on the respective voltages on bit lines 72 and 73.

In basic operation, bit line load 74 serves two functions. First, bit line load 74 provides an active pull-up on both bit lines 72 and 73 for proper development of voltages BL and $\overline{\text{BL}}$ during the read cycle. During the read cycle, transistors 103 and 104 provide voltages on bit lines 72 and 73 in response to a differential current therefrom. In addition, transistors 106 and 107, which are always conductive, weakly pull up bit lines 72 and 73. Transistor 108 is also conductive during the read cycle to limit a differential voltage to a small amount, the small amount being just large enough to sense. Second, bit line load 74 equalizes and precharges the voltages on bit lines 72 and 73 during the write recovery period. Write recovery occurs during the transition from a write cycle to a read cycle. The precharging is accomplished by transistors 103 and 104 providing predetermined voltages on bit lines 72 and 73, and the equalization is accomplished by transistor 108 coupling together bit lines 72 and 73. The action of transistors 103, 104 and 108 ensures that voltages on bit lines 72 and 73 are substantially equal at the end of the write recovery period. Bit line load 74 provides an improvement over bit line load 20 of FIG. 1 because a worst-case reverse bias on bipolar transistors 103 and 104 is limited to a predetermined voltage, the predetermined voltage ensuring an acceptable mean life for the transistors under worst case conditions.

Specifically, transistor 101 provides a voltage on node 110 at one base-to-emitter diode voltage drop ($V_{BE}$) below the voltage on the signal EQBIAS, or (EQBIAS $- V_{BE}$). Similarly, transistor 102 provides a voltage on node 110 at a voltage equal to (EQBIAS $- V_{BE}$). Note that base-to-emitter diode voltage drop $V_{BE}$ is assumed to be equal for all transistors. In reality, bipolar transistor emitter size determines in part the $V_{BE}$ of a transistor; however, minor variations in $V_{BE}$ of the various transistors does not affect the invention. EQBIAS is set somewhat less than $V_{DD}$, and are made substantially independent of fluctuations in $V_{DD}$. If $V_{DD}$ is approximately 5 volts, EQBIAS may be set to approximately 4.2 volts. If the $V_{BE}$ of transistor 101 is 0.7 volts, then the voltage on node 110 is equal to approximately 3.5 volts.

During the write recovery period, transistors 103 and 104 increase the voltage on bit lines 72 and 73 to (EQLOC $- V_{BE}$). Signal EQLOC is provided at approximately EQBIAS during the read cycle. EQLOC is negated at a logic low of approximately two $V_{BE}$S above $V_{SS}$, about 1.4 volts, when a corresponding memory block is selected during the write cycle, and is asserted at a logic high of approximately EQBIAS, at about 4.2 volts, otherwise. The maximum reverse bias voltage ($V_{RBMAX}$) on transistors 103 and 104 occurs during a write cycle:

$$V_{RBMAX} = BL(HIGH) - EQLOC(LOW) \qquad (2)$$

or approximately $3.5 - 1.4 = 2.1$ volts. If $V_{BE}$ is equal to 0.7 volts and $V_{SS}$ is equal to 0 volts, $V_{RBMAX}$ would equal approximately 2.1 volts, which is significantly less than that of prior art bit line load 20 of FIG. 1.

The voltage supplied by transistor 101 and resistor 105 on node 110 may be shared between several bit line loads; similarly the voltage provided by transistor 102 on node 111 may be shared between several bit line loads. Thus, bit line load 74 is an equivalent representation of the bit line load circuit and does not represent all components unique to each bit line load. In the preferred embodiment, node 110 is shared by 64 bit line loads; the voltage on node 110 is provided by eight identical circuits within block 50 each having components corresponding to transistor 101 and resistor 105. The voltage on node 111 is shared between all sixteen memory blocks 40–55 of FIG. 2, with each memory block providing an identical circuit, the circuit comprising a transistor corresponding to transistor 102 having an emitter connected to node 111.

The combination of transistor 101 and resistor 105 to provide the voltage on node 110 has certain desired effects for the prevention of self-boosting. Self-boosting occurs when the voltage on the base of a bipolar transistor increases rapidly, where the emitter is coupled to a highly capacitive load. The base-emitter PN junction has an associated junction capacitance; when the voltage on the base is suddenly increased, a large base-emitter voltage is developed (since the highly capacitively load resists a sudden increase in voltage). The capacitance of a PN junction increases greatly when the $V_{BE}$ exceeds one diode voltage drop. Therefore, the base-emitter junction capacitance boosts the level of the base as the voltage at the emitter rises. Self-boosting can be stopped by reducing the charge on the base. One way to reduce the charge on the base is to cause the transistor to go into saturation, by forward biasing the base-collector diode. Transistor 101 and resistor 105 decrease the effect of self-boosting on the bases of transistors 103 and 104 by decreasing the voltage on the collectors of transistors 103 and 104 when a large collector current flows (during write recovery). Resistor 105 causes the voltage on node 110 to be at $V_{DD}$ when substantially no current flows, which occurs when EQLOC is at a logic low. In actuality a small reverse saturation current flows but if resistor 105 is sized correctly this current can be ignored. When EQLOC switches to a logic high, either transistor 103 or 104 becomes initially active because its base-emitter junction is forward biased into a bit line at a low voltage, and its base-collector junction is reverse biased. A collector current is provided flowing into node 110. With an appreciable current, the voltage on node 110 begins to drop due to the IR drop in resistor 105. However, transistor 101 keeps the voltage on node 110 from dropping below (EQBIAS$-V_{BE}$). When the base voltage of transistor 103 or transistor 104 rises by one diode voltage drop above (EQBIAS$-V_{BE}$) the excess base charge is discharged through the base-collector diode, and self-boosting is stopped. As the collector current of transistor 103 decreases, resistor 105 increases the voltage on the collector of transistor 103 to bring transistor 103 out of saturation.

Referring again to FIG. 3, two sources of reverse bias on base-to-emitter junctions of transistors 103 and 104 of FIG. 4 may be identified. First, as previously discussed, a reverse bias may be formed during a write cycle. The voltage on bit lines 72 and 73 is (EQLOC$-V_{BE}$) when precharging is complete. During a write cycle, EQLOC is provided as a logic low voltage. Thus, a difference between a logic high voltage and a logic low voltage on EQLOC must be limited to a predetermined number to assure an acceptable transistor life under worst case conditions. Second, during the write cycle, data input buffer 39 of FIG. 2 provides a data bit to be stored differentially onto a write global data line pair. Column decoder 62 then uses predecoded column signals WLOC0-WLOC7 to couple the write global data line pairs to selected bit line pairs. To ensure that the worst case base-to-emitter reverse bias is less than the predetermined number established by EQLOC, data input buffer 39 of FIG. 2 limits a logic high voltage on a write global data line, for example WGDL0 or $\overline{WGDL0}$, to (EQLOC$-V_{BE}$). Note that column decoder 62 may decrease this voltage slightly when coupling the write global data lines to the bit line pairs.

Figure 5:
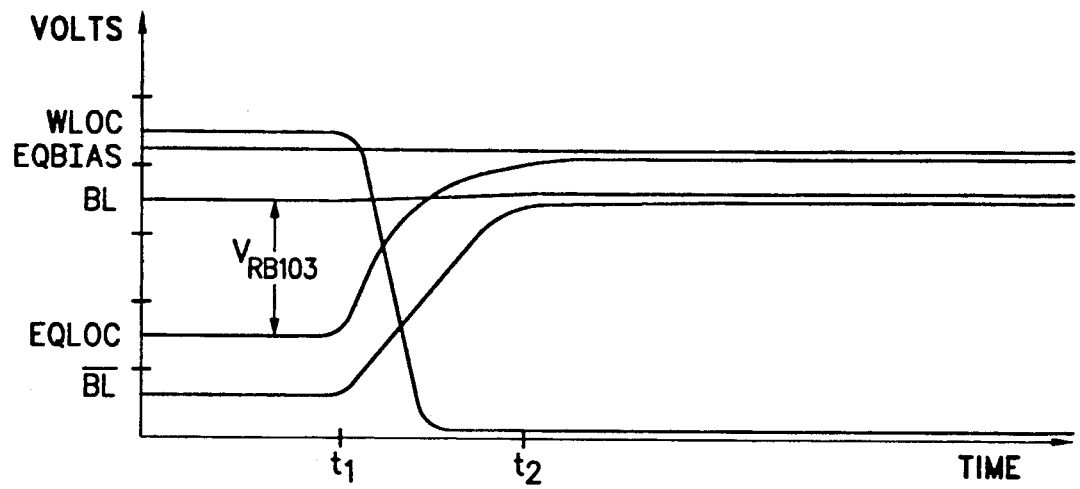
FIG. 5 illustrates a timing diagram of signals pertinent to FIG. 4.

Typical waveforms of control signals EQLOC and WLOC and other pertinent signals are shown in FIG. 5. The signals represented are WLOC, EQBIAS, BL, $\overline{BL}$, and EQLOC. FIG. 5 shows the variation in voltage of each of the pertinent signals with respect to time. A point in time labelled "t1" along the horizontal axis represents approximately a time division between a write cycle and a read cycle. Before time t1, the write cycle is in progress; between t1 and a time labelled "t2" is the write recovery period. EQBIAS is constant at approximately 4.2 volts. During the write cycle, a voltage is developed between BL and $\overline{BL}$. As previously noted, the voltage on BL and $\overline{BL}$ is provided by data input buffer 39 of FIG. 2 onto write global data lines which are coupled to column decoder 62 of FIG. 3 to selected bit line pairs. In the illustrated example a binary 1 is being provided as a positive differential voltage between BL and $\overline{BL}$. BL is at approximately 3.5 volts, while $\overline{BL}$ is approximately one $V_{BE}$ above $V_{SS}$, or about 0.7 volts. Therefore, there is a differential voltage of about 2.8 volts which is sufficient to ensure a fast transfer of data when the contents of a selected memory cell are overwritten during the write cycle. EQLOC is at ($V_{SS}+2V_{BE}$), or about 1.4 volts. When the write recovery period begins, EQLOC begins to rise at t1. As EQLOC rises, $\overline{BL}$ also rises. At the same time, WLOC is negated, which makes transistor 108 of FIG. 4 conductive, coupling bit lines 72 and 73 together. The voltage on $\overline{BL}$ rises until, at a time labelled "t2", it approximately equals the voltage on BL. The maximum reverse bias, labelled "$V_{RB103}$", occurs in this case on transistor 103. In the illustrated embodiment, $V_{RB103}$ is $3.5-1.4=2.1$ volts. $V_{RB103}$ is therefore much less than the $V_{RBMAX}$ of 4.3 volts associated with prior art bit line load 20 of FIG. 1. The logic high and logic low voltages chosen for EQLOC, the source voltages of transistors 106 and 107 (shown in FIG. 4), and the voltages provided by data input buffer 39 (shown in FIG. 2) which are eventually coupled to corresponding bit lines, assure a worst case reverse bias of approximately 2.1 volts to guarantee a mean transistor lifetime of at least 10 years under worst case conditions. The logic high and logic low voltages for EQLOC also assure a fast transfer of data during the write cycle. The worst case conditions occur when a given memory cell is continually written to, at maximum specified voltage for $V_{DD}$, and at minimum specified temperature. Note that other transistor lifetimes may be assured by choosing smaller worst-case reverse-bias voltages.

Figure 6:
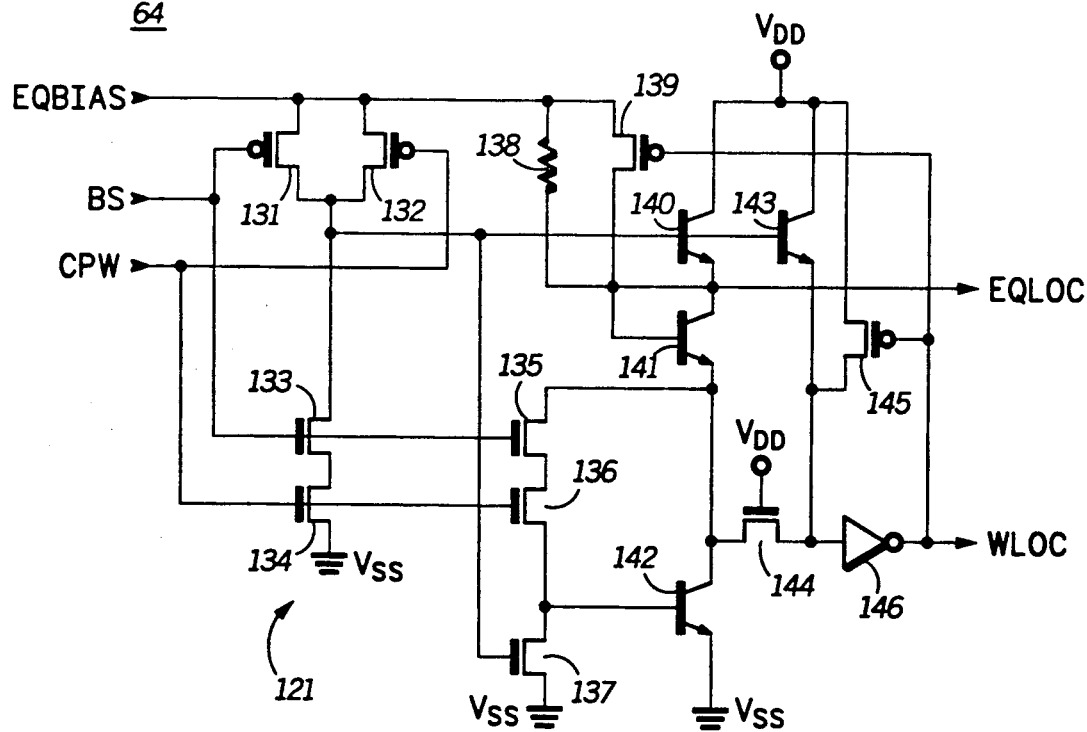
FIG. 6 illustrates in partial schematic form the bit line load control circuit of FIG. 3 for use with the bit line load of FIG. 4.

FIG. 6 illustrates in partial schematic form control signal generator circuit 64 for use with the bit line load of FIG. 4. Circuit 64 comprises a NAND gate 121, N-channel transistors 135, 136, and 137, a resistor 138, a P-channel transistor 139, NPN transistors 140, 141, 142, and 143, an N-channel transistor 144, a P-channel transistor 145, and an inverter 146. NAND gate 121 comprises P-channel transistors 131 and 132, and N-channel transistors 133 and 134.

Transistor 131 has a source connected to EQBIAS, a gate for receiving signal BS, and a drain providing an output terminal of NAND gate 121. Transistor 132 has a source connected to EQBIAS, a gate for receiving signal labelled "CPW", and a drain connected to the drain of transistor 131. Transistor 133 has a drain connected to the drain of transistor 131, a gate for receiving signal BS, and a source. Transistor 132 has a drain connected to the source of transistor 133, a gate for receiving signal CPW, and a source connected to $V_{SS}$. Transistor 135 has a drain, a gate for receiving signal BS, and a source. Transistor 136 has a drain connected to the source of transistor 135, a gate for receiving signal CPW, and a source. Transistor 137 has a drain connected to the source of transistor 136, a gate connected to the drain of transistor 131, and a source connected to $V_{SS}$. Resistor 138 has a first terminal connected to EQBIAS, and a second terminal for providing EQLOC. Transistor 139 has a source connected to EQBIAS, a gate for receiving signal WLOC, and a drain connected to the second terminal of resistor 138. Transistor 140 has a collector connected to $V_{DD}$, a base connected to the drain of transistor 131, and an emitter connected to the second terminal of resistor 138 and the drain of transistor 139. Transistor 141 has a collector connected to the emitter of transistor 140, a base connected to the second terminal of resistor 138 and to the drain of transistor 139, and an emitter connected to the drain of transistor 135. Transistor 142 has a collector connected to the emitter of transistor 141, a base connected to the drain of transistor 137, and an emitter connected to $V_{SS}$. Transistor 143 has a collector connected to $V_{DD}$, a base connected to the drain of transistor 131, and an emitter. Transistor 144 has a first current electrode connected to the emitter of transistor 141, a gate connected to $V_{DD}$, and a second current electrode connected to the emitter of transistor 143. Transistor 145 has a source connected to $V_{DD}$, a gate for receiving signal WLOC, and a drain connected to the emitter of transistor 143. Inverter 146 has an input terminal connected to the emitter of transistor 143, and an output terminal for providing signal WLOC.

Circuit 64 may be understood first by the logical relation established between the input signals, and then by the way the components shown in FIG. 6 perform the functions. BS is a signal asserted at a logic high when a block in which a corresponding bit line pair is located is enabled. CPW is a signal asserted at a logic high when a write to the corresponding bit line pairs occurs, and corresponds to one signal of the group CPW0-CPW7. EQLOC, provided on the emitter of transistor 140, is a logical NAND between signals BS and CPW. WLOC, on the other hand, is provided as an inverse of the logical NAND between CPW and BS; in other words, as a logical AND between BS and CPW. While WLOC is provided at CMOS levels, with a logic high of approximately $V_{DD}$ and a logic low of approximately $V_{SS}$, EQLOC is provided with a logic high of approximately EQBIAS, and a logic low of approximately $V_{SS}+2V_{BE}$. As described earlier, limitation of the logic low voltage of EQLOC improves the mean lifetime of transistors 103 and 104 of FIG. 4.

The output terminal of NAND gate 121 is provided by the drain of transistor 131. When the output terminal of NAND gate 121 is a logic high, the base-emitter junction of transistor 140 becomes forward biased to provide EQLOC as a logic high. When the output of NAND gate 121 is a logic high, either transistor 131 or transistor 132, or both, is conductive. Since both transistors 131 and 132 are P-channel transistors connected to voltage EQBIAS, at approximately 4.2 volts, a logic low voltage on the gates makes the transistors conductive. A drain-to-source voltage $V_{DS}$ of each transistor is approximately zero volts, and the voltage on the output terminal of NAND gate 121 is approximately at EQBIAS. Therefore, the logic high voltage of EQLOC is approximately EQBIAS. On the other hand, (EQBIAS $-V_{BE}$) appears on the input terminal of inverter 146 and is latched to $V_{DD}$ by transistor 145. This voltage is recognized as a logic high by inverter 146, and the output terminal of inverter 136 is driven to a logic low. Transistor 139 is placed into saturation, increasing EQLOC to EQBIAS. In essence, then, inverter 146 and transistor 139 form a weak latch to increase EQLOC to EQBIAS once EQLOC crosses from a logic low to a logic high. Transistor 137 is made conductive by the output of NAND gate 121, and couples the base of transistor 142 to $V_{SS}$, keeping the base-emitter junction of transistor 142 from becoming forward biased, and therefore keeping any current from flowing into the collector of transistor 141 or 142.

When the output terminal of NAND gate 121 is a logic low, caused by both BS and CPW being a logic high, EQLOC is provided at approximately $(V_{SS}+2V_{BE})$. The base-emitter junction of transistor 140 becomes reverse biased, and transistor 139 becomes nonconductive. Transistors 135 and 136 both become conductive and couple the collector of transistor 142 to the base of transistor 142. Transistor 137 becomes nonconductive. Therefore, EQLOC is connected to $V_{SS}$ through two diode-connected transistors 141 and 142. Resistor 138 provides the bias current to keep the base-to-emitter diodes of transistors 141 and 142 forward biased.

With regard to WLOC, when the output of NAND gate 121 is a logic high, the voltage on the input terminal of inverter 146 is a logic high, and the output terminal of inverter 146 is a logic low. Transistor 145 then becomes conductive to provide a weak latch when the voltage at the input terminal of inverter 146 crosses from a logic low to logic high. When the output of NAND gate 121 switches to a logic low, transistor 143 becomes nonconductive. The high voltage developed on the input terminal of inverter 146 then causes transistor 144 to be conductive and to discharge the voltage on the input terminal of inverter 146 through transistor 142 to $V_{SS}$, until it passes below the switchpoint of inverter 146. It should be remembered that circuit 64 is but one embodiment for providing the waveforms shown in FIG. 5, and that other circuits are possible.

It should be apparent by now that a memory with improved write recovery and improved reliability has been described. In the illustrated embodiment the memory comprises a plurality of memory blocks, each memory block having a plurality of memory cells located at intersections of local word lines and bit line pairs. Coupled to each bit line pair is a bit line load comprising first and second bipolar transistors, and third, fourth, and fifth P-channel MOS transistors. The first and second bipolar transistors are biased such that a worst-case reverse bias is limited to a predetermined number. The limitation of the worst-case reverse bias results from limiting the logic high voltage on the equalization signal used to bias the bases of the first and second transistors, providing a minimum logic low voltage on the equalization signal, and limiting the logic high voltage on the bit lines during the write cycle. The predetermined number is chosen so that the application of the worst-case reverse bias assures a given mean lifetime under worst case conditions, of the first and second transistors. Using bipolar transistors, the bit line load provides a fast write recovery, and the limitation of the worst case reverse bias improves reliability.

Figure 7:
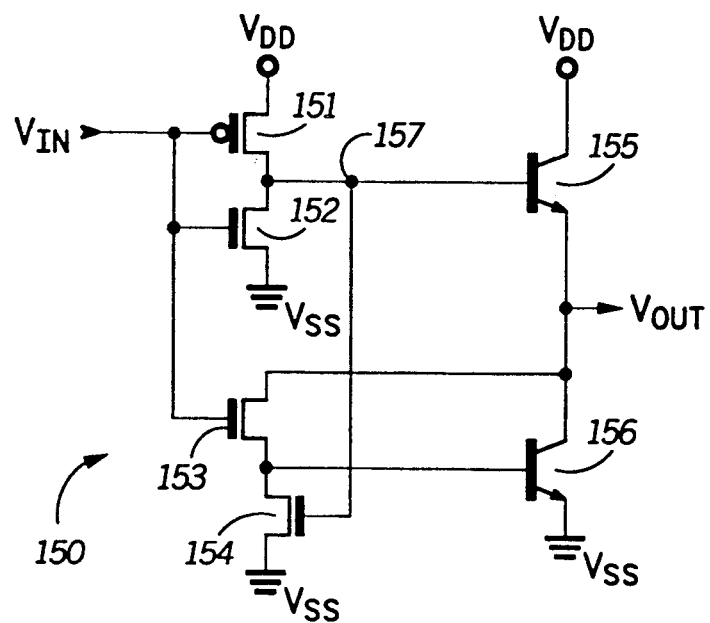
FIG. 7 illustrates in schematic form a BICMOS logic circuit in accordance with the prior art.

FIG. 7 illustrates in schematic form a BICMOS logic circuit 150 in accordance with the prior art. Logic circuit 150 comprises a P-channel transistor 151, N-channel transistors 152, 153, and 154, and NPN bipolar transistors 155 and 156. Transistor 151 has a source connected to $V_{DD}$, a gate for receiving an input signal labelled "$V_{IN}$", and a drain connected to a node 157. Transistor 152 has a drain connected to the drain of transistor 151, a gate for receiving $V_{IN}$, and a source connected to $V_{SS}$. Transistor 153 has a drain connected to a signal labelled "$V_{OUT}$", a gate for receiving $V_{IN}$, and a source. Transistor 154 has a drain connected to the source of transistor 153, a gate connected to the drain of transistor 151, and a source connected to $V_{SS}$. Transistor 155 has a collector connected to $V_{DD}$, a base connected to the drain of transistor 151 at node 157, and an emitter for providing $V_{OUT}$. Transistor 156 has a collector connected to the emitter of transistor 155, a base connected to the source of transistor 153, and an emitter connected to $V_{SS}$.

Logic circuit 150 performs a logical inversion of input signal $V_{IN}$ to provide output signal $V_{OUT}$. $V_{OUT}$ is provided by either of two bipolar transistors 155 or 156, with a desired logic high output voltage of $(V_{DD}-V_{BE})$, and a logic low output voltage of $(V_{SS}+V_{BE})$. When $V_{IN}$ is a logic high, transistor 151 is nonconductive, and transistors 152 and 153 are conductive. The drain of transistor 152 is at approximately $V_{SS}$, so that transistor 154 is nonconductive. The base of transistor 155 is at approximately $V_{SS}$, preventing the base-emitter junction of transistor 155 from becoming forward biased. Transistor 153 is conductive, and the gate-to-source voltage ($V_{GS}$) of transistor 153 is large enough to make the drain-to-source voltage ($V_{DS}$) approximately zero. The base of transistor 156 is therefore essentially coupled to the collector of transistor 156. The base of transistor 156 is at one $V_{BE}$ above $V_{SS}$, and thus $V_{OUT}$ is equal to $(V_{SS}+V_{BE})$. When $V_{IN}$ is a logic low, transistor 151 becomes conductive and the voltage on the base of transistor 155 increases. The $V_{GS}$ of transistor 151 is large enough to make the drain-to-source voltage $V_{DS}$ approximately zero. The voltage on node 157 is thus approximately equal to $V_{DD}$. Transistors 152 and 153 are both nonconductive. Transistor 154 couples the base of transistor 156 to $V_{SS}$, the voltage to which the emitter is coupled, which prevents transistor 156 from becoming conductive. The desired output voltage $V_{OUT}$ is approximately equal to $V_{DD}$ minus the $V_{BE}$ of transistor 155.

The self-boosting problem occurs when $V_{OUT}$ changes from a logic low, at one $V_{BE}$ above $V_{SS}$, to a logic high, and the load being driven by logic circuit 150 (not shown) is highly capacitive. The highly capacitive load resists the rapid change in voltage across it. Therefore, a large base-to-emitter voltage is developed on the base-emitter junction of transistor 155 immediately after $V_{IN}$ switches from a logic high to a logic low. The large base-emitter voltage causes a large junction capacitance to form at the base-emitter PN junction. As $V_{OUT}$ (the voltage at the negative terminal of the base-emitter capacitor) rises, the voltage at node 157 (the positive terminal of the base-emitter capacitor) is boosted in response. The self-boosting of the voltage on the base in turn causes $V_{OUT}$ to increase. Self-boosting is stopped eventually when the voltage on the base of transistor 155 rises to a level at which the base-collector voltage exceeds one diode voltage drop, or when node 157 discharges through transistor 151 to $V_{DD}$. Typically this voltage is approximately equal to $(V_{DD}+V_{BE})$; however, since emitter area is used to determine bipolar transistor size, the diode voltage drop of the base-collector diode is not necessarily equal to $V_{BE}$. In some circuits, the effect of this rise in voltage is especially deleterious. For example, if data input buffer 39 of FIG. 2 were susceptible to self-boosting, the worst-case reverse bias on corresponding bipolar transistors of bit line load 74 of FIG. 4 would be increased, decreasing mean transistor lifetime.

Figure 8:
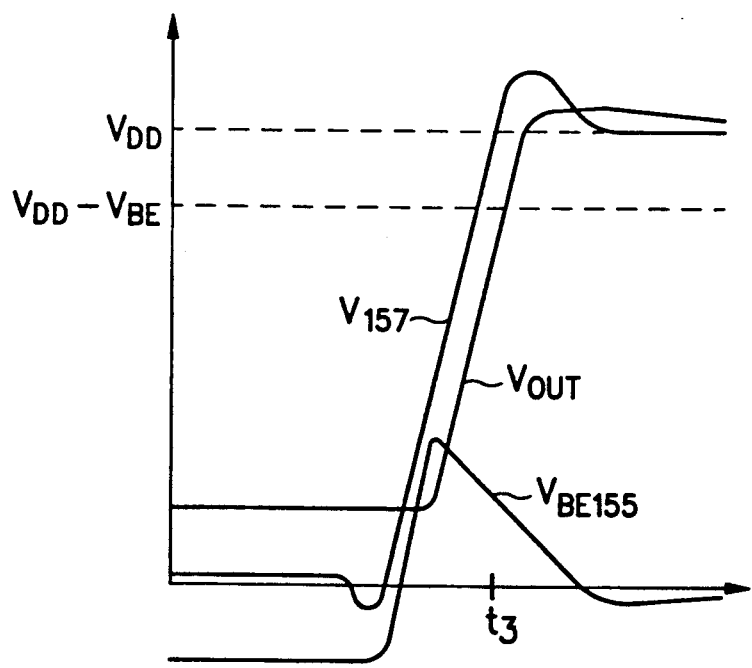
FIG. 8 is a timing diagram showing the self-boosting phenomenon associated with the prior art BICOMS logic circuit of FIG. 7.

FIG. 8 is a timing diagram showing the self-boosting phenomenon associated with the prior art BICOMS logic circuit 150 of FIG. 7. The vertical axis shows voltage, and the horizontal axis time. Shortly before a time labelled "t3", $V_{IN}$ switches from a logic high to a logic low (not shown in FIG. 8). Briefly, the base-to-emitter voltage of transistor 155, labelled "$V_{BE155}$", rises substantially above a forward biased diode voltage drop. This large voltage occurs in response to circuit 150 of FIG. 7 being unable to switch a large capacitive load coupled to $V_{OUT}$ instantaneously. The large base-to-emitter voltage cause the base-emitter diffusion capacitance to increase substantially. The voltage on node 157, labelled "$V_{157}$", begins to rise, and $V_{OUT}$ also rises. $V_{157}$ however reaches and exceeds the positive power supply voltage $V_{DD}$ around time t3, due to the self-boosting of transistor 155. As a result, $V_{OUT}$, which follows the emitter at one $V_{BE}$ below the voltage on the emitter, reaches and exceeds its desired value, labelled "$V_{DD}-V_{BE}$" on the vertical axis. When $V_{157}$ exceeds $V_{DD}$, a discharge path to $V_{DD}$ is established through transistor 151. Whether $V_{157}$ continues to increase depends on the size of transistor 151. If $V_{157}$ continues to increase, then shortly after time t3 $V_{157}$ reaches a value of one base-to-collector diode voltage drop above $V_{DD}$. At this point, the base-collector diode becomes forward biased, and the charge built up on the base of transistor 155 begins to discharge through transistor 157 to $V_{DD}$. Even though transistor 151 or transistor 157 can discharge $V_{157}$ to $V_{DD}$, as soon as $V_{157}$ exceeds $V_{DD}$ $V_{OUT}$ exceeds its desired value. However, while $V_{157}$ begins to drop, the voltage on $V_{OUT}$ remains essentially fixed, because no discharge path is provided for $V_{OUT}$. Hence, $V_{OUT}$ remains at a value higher than the desired value, $(V_{DD}-V_{BE})$. In some circuit applications, such as data input buffer 39 of FIG. 2, such a logic high voltage for $V_{OUT}$ can be deleterious to the operation of the memory.

FIG. 9 illustrates in partial schematic form one embodiment of a logic circuit 160 in accordance with the present invention. Logic circuit 160 comprises an NPN transistor 161; a resistor 162; a P-channel transistor 163; N-channel transistors 164, 165, and 166; an inverter 167; and NPN transistors 168 and 169. Transistor 161 has a collector connected to $V_{DD}$, a base for receiving a reference voltage labelled "$V_{R1}$", and an emitter coupled to a node 170. Resistor 162 has a first terminal for receiving a reference voltage labelled "$V_{R2}$", and a second terminal connected to the emitter of transistor 161 on node 170. Transistor 163 has a source connected to the emitter of transistor 161, a gate for receiving a signal labelled "$\overline{DATA_{IN}}$", and a drain connected to a node 171. Transistor 164 has a drain connected to the drain of transistor 163, a gate for receiving $\overline{DATA_{IN}}$, and a source connected to $V_{SS}$. Transistor 165 has a drain, a gate for receiving $\overline{DATA_{IN}}$, and a source. Transistor 166 has a drain connected to the source of transistor 165, a gate, and a source connected to $V_{SS}$. Inverter 167 has an input terminal for receiving $\overline{DATA_{IN}}$, and an output terminal connected to the gate of transistor 166. Transistor 168 has a collector connected to $V_{DD}$, a base connected to the drain of transistor 163, and an emitter connected to the drain of transistor 165 and providing a signal labelled "WGDL". Transistor 169 has a collector connected to the emitter of transistor 168, a base connected to the source of transistor 165, and an emitter connected to $V_{SS}$.

When $\overline{DATA_{IN}}$ is a logic high, transistor 163 is nonconductive. Transistor 164 is conductive, and because $\overline{DATA_{IN}}$ is much greater than $V_{SS}$, the $V_{DS}$ of transistor 164 is approximately zero and node 171 is essentially coupled to $V_{SS}$. Transistor 165 is conductive, coupling the collector of transistor 169 to the base of transistor 169, and transistor 166 is nonconductive. Therefore, WGDL is provided at a logic low of one $V_{BE}$ above $V_{SS}$. Since transistor 163 is nonconductive, no current flows through resistor 162 and the voltage on node 170 is equal to $V_{R2}$. When $\overline{DATA_{IN}}$ is then provided at a logic low, transistor 165 becomes nonconductive, and transistor 166 becomes conductive and essentially couples the base of transistor 169 to $V_{SS}$. Transistor 164 becomes nonconductive, and transistor 163 becomes conductive. Since $\overline{DATA_{IN}}$ is much less than $V_{R2}$, the $V_{DS}$ of transistor 163 is approximately zero. The voltage on node 171 begins to rise as base current begins to flow. As base current begins to flow, however, the voltage on node 170 decreases. The voltage on node 170 decreases until $V_{R2}$ minus the voltage drop due to the current times resistance of resistor 162 (IR drop) equals $V_{R1}$ minus the $V_{BE}$ of transistor 161. The $V_{BE}$ of transistor 161 determines the minimum voltage on node 170 when current flows, namely $(V_{R1}-V_{BE})$.

Note that FIG. 9 shows an embodiment in which WGDL is provided in response to a logical inversion of $DATA_{IN}$. If the result of the logical operation is true ($\overline{DATA_{IN}}$ is a logic low), then transistor 168 is made conductive to provide a logic high output voltage on WGDL. If the result of the logic operation is false ($\overline{DATA_{IN}}$ is a logic high), then the collector of transistor 169 is coupled to the base of transistor 169 and a logic low of one base-to-emitter voltage above $V_{SS}$ is provided on WGDL. However, other logic operations are contemplated within the scope of the present invention. For example, two P-channel transistors respectively receiving first and second active-low input signals may be coupled in series between nodes 170 and 171, with two N-channel transistors respectively receiving the first and second input signals coupled in parallel to each other between node 171 and $V_{SS}$, to form a two-input NOR gate. If the result of the NOR operation is true (both inputs are a logic low), then the two P-channel transistors are conductive and node 170 is coupled to node 171 to provide a logic high on WGDL. If either the first or the second input signal is a logic high (the result of the logical NOR is false), then transistor 168 would be made nonconductive and WGDL provided at a logic low. In such a circuit the present invention likewise prevents the self-boosting of the base of transistor 168.

The voltage on node 171 increases rapidly until it equals $(V_{R1}-V_{BE})$ because transistor 161 is conductive. When the voltage on node 171 reaches $(V_{R1}-V_{BE})$, transistor 161 becomes nonconductive and the base current for transistor 168, now supplied through resistor 162, is reduced. Extra base current for transistor 168 beyond that supplied through resistor 162 is then supplied by the base-emitter junction capacitor of transistor 168. The self-boosting phenomenon works to increase the voltage on node 171 beyond $(V_{R1}-V_{BE})$. However, as the voltage on node 171 begins to rise past $(V_{R1}-V_{BE})$, base current is no longer supplied through transistor 161, and the impedance between $V_{R2}$ and node 171 is much greater than the impedance between $V_{R1}$ and node 171 when transistor 161 was conductive. FIG. 10 plots the characteristic impedance labelled "Z" between node 171 and $V_{R1}$ or $V_{R2}$ on the vertical axis, against voltage difference between $V_{R1}$ and node 171 on the horizontal axis. To the right of a voltage labelled "v1", the impedance represented is between $V_{R2}$ and node 171 and is determined by transistor 163, namely the on resistance of transistor 163. However, as the voltage on node 171 ($V_{171}$) rises due to self-boosting, the voltage difference $(V_{R1}-V_{171})$ decreases, and eventually transistor 161 becomes nonconductive and Z is determined by resistor 162 and $V_{R2}$. To the left of v1, which is equal to a voltage difference of $(V_{R1}-V_{BE})$, Z is determined by resistor 162. This impedance is much larger, and reduces the base current supplied to transistor 168. With the reduction in base current supplied to transistor 168, the base-emitter capacitor begins to discharge to supply the remaining base current, which stops the self boosting.

In a preferred embodiment logic circuit 160 of FIG. 9 provides input data signals to corresponding write global data lines of memory 30 of FIG. 2. In the preferred embodiment, $V_{R1}=V_{R2}=$EQBIAS (a bias signal set somewhat less than $V_{DD}$, and are made substantially independent of fluctuations in $V_{DD}$), $\overline{DATA_{IN}}$ is equal to a corresponding data bit or a complement of the corresponding data bit (conditioned by control signals not shown in FIG. 9), and WGDL is equal to a corresponding write global data line signal of the group WGDL0-WGDL7 and $\overline{WGDL0}$-$\overline{WGDL7}$. Note that both $\overline{DATA_{IN}}$ and WGDL are designated generically because there are identical circuits for each corresponding input data bit and complement of the input data bit. For each bit of DATA, two corresponding logic circuits respectively provide true and complement write global data line signals. In the preferred embodiment, node 170 is shared between a logic circuit providing true and complement write global data line signals; in other embodiments, node 170 may be particular to a single logic circuit, or may be shared by several logic circuits. While in the preferred embodiment $V_{R1}=V_{R2}$, using different reference voltages varies the position of v1 on the horizontal axis. As $V_{R1}$ decreases, v1 shifts to the right, and the voltage difference at which the characteristic impedance increases dramatically increases.

FIG. 11 shows a timing diagram of signals pertinent to FIG. 9 useful in understanding the present invention. The vertical axis shows voltage, and the horizontal axis time. In FIG. 11, $\overline{DATA_{IN}}$ changes from a logic high to a logic low (not shown) before a time labelled "t4". As base current is being conducted through transistor 168, the voltage on node 170 begins to drop until it reaches a desired value of $(V_{R1}-V_{BE})$. As soon as the voltage at node 171 reaches $(V_{R1}-V_{BE})$ at time t4, the impedance between $V_{R2}$ and node 171 increases dramatically and decreases the base current supplied to transistor 168. Thus the characteristic impedance between $V_{R1}$ and node 171 at time t4 corresponds to voltage v1 in FIG. 10. After t4, the voltage difference $(V_{R1}-V_{171})$ is below v1, and self-boosting is stopped. $V_{171}$ approaches $V_{R2}$, and WGDL reaches but does not exceed $(V_{R1}-V_{BE})$, the desired voltage.

It should be apparent by now that a logic circuit which prevents self-boosting of an output signal has been provided. The logic circuit uses a parallel connection of a resistor and a bipolar transistor to supply current to the base of an output transistor. The combined action of the resistor and the bipolar transistor reduces the base current supplied to the output transistor after the voltage on the base of the output transistor rises to within a $V_{BE}$ of a reference voltage. The logic circuit is useful in applications in which a logic high voltage must be limited to a predetermined level. For example the logic circuit is useful in a memory in which a voltage on a bit line pair must be limited in part by limiting the voltage on a corresponding write global data line pair.

While the invention has been described in the context of a preferred embodiment, it will be apparent to those skilled in the art that the present invention may be modified in numerous ways and may assume many embodiments other than that specifically set out and described above. For example, the logic circuit may be used in other types of circuit applications in which self-boosting would be deleterious to circuit operation. Accordingly, it is intended by the appended claims to cover all modifications of the invention which fall within the true spirit and scope of the invention.

I claim:

1. A logic circuit comprising:
   a resistor having a first terminal coupled to a first reference voltage terminal, and a second terminal, said first reference voltage terminal different from a first power supply voltage terminal;
   a first transistor having a collector coupled to said first power supply voltage terminal, a base coupled to a second reference voltage terminal, and an emitter coupled to said second terminal of said resistor;
   a second transistor having a collector coupled to said first power supply voltage terminal, a base, and an emitter for providing an output signal;
   switching means, for coupling said second terminal of said resistor to said base of said second transistor in response to a true result of a logical operation on at least one input signal, and for coupling said base of said second transistor to a second power supply voltage terminal in response to a false result of said logic operation; and
   discharge means coupled to said emitter of said second transistor, for coupling said output signal to a second power supply voltage terminal in response to a false result of said logical operation on said at least one input signal.

2. The logic circuit of claim 1 wherein said first and second reference voltages are equal.

3. A logic circuit comprising:
   a resistor having a first terminal coupled to a first reference voltage terminal, and a second terminal, said first reference voltage terminal different from a first power supply voltage terminal;
   a first transistor having a collector coupled to said first power supply voltage terminal, a base coupled to a second reference voltage terminal, and an emitter coupled to said second terminal of said resistor;
   a second transistor having a first current electrode coupled to said second terminal of said resistor, a control electrode for receiving an input signal, and a second current electrode;
   means for coupling said second current electrode of said second transistor to a second power supply voltage terminal when said second transistor is nonconductive in response to said input signal; and
   a third transistor having a collector coupled to said first power supply voltage terminal, a base coupled to said second current electrode of said second transistor, and an emitter for providing an output signal.

4. The logic circuit of claim 3 wherein said coupling means comprises a fourth transistor having a first current electrode coupled to said second current electrode of said second transistor, a control electrode for receiving said input signal, and a second current electrode coupled to said second power supply voltage terminal.

5. The logic circuit of claim 4 wherein said second and fourth transistors have opposite conductivity types.

6. The logic circuit of claim 5 wherein said first and third transistors are NPN bipolar transistors.

7. The logic circuit of claim 3 further comprising discharge means coupled to said emitter of said third transistor, for coupling said output signal to a negative power supply voltage terminal in response to said input signal.

8. The logic circuit of claim 7 wherein said discharge means comprises:
   a fifth transistor having a first current electrode coupled to said emitter of said third transistor, a control electrode coupled to said input signal, and a second current electrode;
   a sixth transistor having a collector coupled to said emitter of said third transistor, a base coupled to said second current electrode of said fifth transistor, and an emitter coupled to said negative power supply voltage terminal;
   an inverter having an input terminal for receiving said input signal, and an output terminal; and
   a seventh transistor having a first current electrode coupled to said second current electrode of said fifth transistor, a control electrode coupled to said output terminal of said inverter, and a second current electrode coupled to said negative power supply voltage terminal.

9. The logic circuit of claim 8 wherein said fifth and seventh transistors each have opposite conductivity types as that of said second transistor.

10. A method of preventing a self-boosting of a voltage on a base of a first bipolar transistor of a logic circuit above a predetermined voltage, the first bipolar transistor having an emitter for providing an output signal of the logic circuit and a collector coupled to a positive power supply voltage terminal, comprising the steps of:
   providing a first reference voltage having a voltage different from the positive power supply voltage to a first terminal of a resistor;
   providing the positive power supply voltage to a collector of a second bipolar transistor;
   biasing a base of said second bipolar transistor with a second reference voltage;
   providing a first current from an emitter of said second transistor and a second current from said second terminal of said resistor to a first current electrode of an MOS transistor;
   providing a voltage responsive to a true result of a logic operation on at least one input signal to a gate of said MOS transistor; and
   providing a current conducted from a second current electrode of said MOS transistor to the base of the first bipolar transistor.

11. The method of claim 10 further comprising the step of discharging said output signal to a negative power supply voltage terminal in response to a false result of said logic operation on said at least one input signal.

12. The method of claim 11 wherein said step of providing a voltage responsive to a true result of a logic operation further comprises the step of providing a voltage responsive to a true result of a logical inversion on said at least one input signal to a gate of said MOS transistor.

13. The method of claim 10 further comprising the step of making said first and second reference voltages equal.

14. In a memory comprising a plurality of memory cells, the memory cells each providing a pair of complementary bit line signals to a bit line pair when selected during a read cycle, and storing a data bit received on the bit line pair during a write cycle, the data bit represented by a data input signal received by the memory, each bit line coupled to a corresponding write global data line when selected during the write cycle, and a plurality of bit line loads for precharging a voltage on corresponding bit line pairs, each bit line load comprising first and second bipolar transistors having emitters respectively coupled to true and complement bit lines of a corresponding bit line pair, a logic circuit for providing a voltage on a write global data line during the write cycle, comprising:

a resistor having a first terminal coupled to a first reference voltage terminal, and a second terminal, said first reference voltage terminal different from a first power supply voltage terminal;

a first transistor having a collector coupled to said first power supply voltage terminal, a base coupled to a second reference voltage terminal, and an emitter coupled to said second terminal of said resistor;

a second transistor having a first current electrode coupled to said second terminal of said resistor, a control electrode for receiving the data input signal, and a second current electrode;

means for coupling said second current electrode of said second transistor to a second power supply voltage terminal when said second transistor is nonconductive in response to the data input signal; and a third transistor having a collector coupled to said first power supply voltage terminal, a base coupled to said second current electrode of said second transistor, and an emitter coupled to a corresponding write global data line.

15. The logic circuit of claim 14 wherein said coupling means comprises a fourth transistor having a first current electrode coupled to said second current electrode of said second transistor, a control electrode for receiving the data input signal, and a second current electrode coupled to said second power supply voltage terminal.

16. The logic circuit of claim 15 wherein said second and fourth transistors have opposite conductivity types.

17. The logic circuit of claim 16 wherein said first and third transistors are NPN bipolar transistors.

18. The logic circuit of claim 15 further comprising discharge means coupled to said emitter of said third transistor, for coupling said output signal to a negative power supply voltage terminal in response to the data input signal.

19. The logic circuit of claim 18 wherein said discharge means comprises:

a fifth transistor having a first current electrode coupled to said emitter of said third transistor, a control electrode coupled to the data input signal, and a second current electrode;

a sixth transistor having a collector coupled to said emitter of said third transistor, a base coupled to said second current electrode of said fifth transistor, and an emitter coupled to said negative power supply voltage terminal;

an inverter having an input terminal for receiving the data input signal, and an output terminal; and a seventh transistor having a first current electrode coupled to said second current electrode of said fifth transistor, a control electrode coupled to said output terminal of said inverter, and a second current electrode coupled to said negative power supply voltage terminal.

20. The logic circuit of claim 19 wherein said fifth and seventh transistors each have opposite conductivity types as said second transistor.

* * * * *